(12) United States Patent
Matsuo

(10) Patent No.: US 8,217,408 B2
(45) Date of Patent: Jul. 10, 2012

(54) SEMICONDUCTOR LIGHT EMITTING DEVICE

(75) Inventor: Tetsuji Matsuo, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 617 days.

(21) Appl. No.: 12/407,093

(22) Filed: Mar. 19, 2009

(65) Prior Publication Data

US 2009/0236628 A1   Sep. 24, 2009

(30) Foreign Application Priority Data

Mar. 21, 2008   (JP) .................................. 2008-073779

(51) Int. Cl.
*H01L 33/00* (2010.01)
(52) U.S. Cl. .................................. 257/95; 257/E33.074
(58) Field of Classification Search .................... 257/95, 257/E33.067–E33.068, E33.074
See application file for complete search history.

(56) References Cited

U.S. PATENT DOCUMENTS

| 5,393,993 | A | 2/1995 | Edmond et al. | |
| 6,465,810 | B1* | 10/2002 | Tamada et al. | 257/99 |
| 2009/0026468 | A1* | 1/2009 | Sakai et al. | 257/88 |

FOREIGN PATENT DOCUMENTS

JP   2741705   1/1998

* cited by examiner

*Primary Examiner* — David S Blum
*Assistant Examiner* — Daniel Luke
(74) *Attorney, Agent, or Firm* — Oblon, Spivak, McClelland, Maier & Neustadt, L.L.P.

(57) ABSTRACT

A semiconductor light emitting device includes: a conductive substrate; a semiconductor light emitting layer which includes a first semiconductor layer formed on one surface of the conductive substrate and having a first conductivity type, and a second semiconductor layer formed on the first semiconductor layer and having a second conductivity type opposite to the first conductivity type; first light emitting spots which are alternately arranged around a periphery of the semiconductor light emitting layer and emitting light to an exterior from the semiconductor light emitting layer; second light emitting spots having surfaces intersecting with the first light emitting spots and emitting light at an amount smaller than an amount of light emitted via the first light emitting spots; and wirings arranged along the second light emitting spots and electrically short circuiting an area between the first light emitting layer and the surfaces of the conductive substrate.

9 Claims, 4 Drawing Sheets

SEMICONDUCTOR LIGHT EMITTING DEVICE

CROSS REFERENCE TO RELATED APPLICATION

This application is based upon and claims the benefit of priority from the prior Japanese Patent Application No. 2008-073.779 filed on Mar. 21, 2008, the entire contents of which is incorporated herein by reference.

BACKGROUND OF THE INVENTION

1. Field of the Invention

This invention relates to a semiconductor light emitting device, and more particularly relates to a semiconductor light emitting device which includes semiconductor light emitting layers placed on a conductive substrate.

2. Description of the Related Art

Semiconductor light emitting devices like semiconductor light emitting diodes are much in demand at present. Especially, semiconductor light emitting diodes where nitride semiconductors are used as light emitting layers can emit light beams of which wave lengths range from those of ultra-violet to green light beams.

Recently, a technology for forming light emitting layers, made of nitride semiconductors, on conductive substrates of semiconductor light emitting diodes is under development. The technology is effective in increasing flexibility in device designing. Further, conductive substrates are relatively inexpensive. Still, further, the technology is preferable since semiconductor light emitting devices can be fabricated using an existing silicon semiconductor manufacturing process. Silicon (Si) substrates, silicon carbide (SiC) substrates and so on are usable as conductive substrates.

However, it is difficult to make the nitride semiconductor on the conductive substrate and to obtain excellent crystalline light emitting layers. For instance, a layer having high electric resistance is created near an interface between a surface of the conductive substrate and the light emitting layer or near an infant light emitting layer. In such a case, the semiconductor light emitting diode tends to increase its forward voltage, decrease its light emitting efficiency, become heated, and have a short life.

Japanese Patent Publication No. 2,741,705 discloses a semiconductor light emitting diode. In the publication, a light emitting layer is placed on a silicon carbide substrate via a layer having high electric resistance, the light emitting layer and silicon carbide substrate are electrically connected by a metal short circuiting electrode, and the layer having the high electric resistance is bypassed using the metal short circuiting electrode. The semiconductor light emitting diode can suppress an increase of the forward voltage.

However, the cited semiconductor light emitting diode seems to have the following problems. The metal short-circuiting electrode is present on a side surface of the semiconductor light emitting layer. Since the semiconductor light emitting layer emits light via its upper and side surfaces, the light emitted via the side surface is blocked by the metal short circuiting electrode. This means that light emitted via the side surface of the semiconductor light emitting diode cannot be effectively utilized, and that the semiconductor light emitting diode seems to suffer from reduced light emitting efficiency.

The present invention has been contemplated in order to overcome the foregoing problems, and provides a semiconductor light emitting device which can reduce a forward voltage between a conductive substrate and semiconductor light emitting layers, and improve the light emitting efficiency.

SUMMARY OF THE INVENTION

According to a first feature of the embodiment of the invention, a semiconductor light emitting device includes: a conductive substrate; a semiconductor light emitting layer which includes a first semiconductor layer formed on one surface of the conductive substrate and having a first conductivity type, and a second semiconductor layer formed on the first semiconductor layer and having a second conductivity type opposite to the first conductivity type; first light emitting spots which are alternately arranged around a periphery of the semiconductor light emitting layer and emitting light to an exterior from the semiconductor light emitting layer; second light emitting spots having surfaces intersecting with the first light emitting spots and emitting light at an amount smaller than an amount of light emitted via the first light emitting spots; and wirings arranged along the second light emitting spots and electrically short circuiting an area between the first light emitting layer and the surfaces of the conductive substrate.

In the semiconductor light emitting device, the first light emitting spots are preferably in the shape of projections and hollows, and the second light emitting spots are the side surfaces between the first light emitting spots in the semiconductor light emitting layer.

The second light emitting spots are preferably positioned within a critical angle with respect to a planar normal of the first light emitting spots, light being emitted from the semiconductor light emitting surface to the exterior within the critical angle.

The wirings are preferably made of a material having a specific resistance value smaller than a specific resistance value of a path via which a current flows to the conductive substrate from the first semiconductor layer via an interface between them.

In accordance with a second feature of the embodiment of the invention, a semiconductor light emitting device includes: a conductive substrate having a conductor on one surface thereof, a semiconductor light emitting layer which includes a first nitride semiconductor layer positioned on one surface of the conductor of the conductive substrate and having a first conductivity type, and a second nitride semiconductor layer positioned on the first nitride semiconductor layer and having a second conductivity type opposite to the first conductivity type; first light emitting spots which are alternately arranged around a periphery of the first nitride semiconductor light emitting layer and emitting light to an exterior from the first nitride semiconductor light emitting layers; second light emitting spots having a surface intersecting with the first light emitting spots and emitting light at an amount smaller than an amount of light emitted via the first light emitting spots; and wirings arranged along the second light emitting spots and electrically short circuiting an area between the first light emitting layer and the one surface of the conductive substrate.

With the embodiment of the invention, the semiconductor light emitting device can reduce the forward voltage between the conductive substrate and the semiconductor light emitting layer on the conductive substrate, and improve light emitting efficiency.

DETAILED DESCRIPTION OF THE INVENTION

Figure 1:
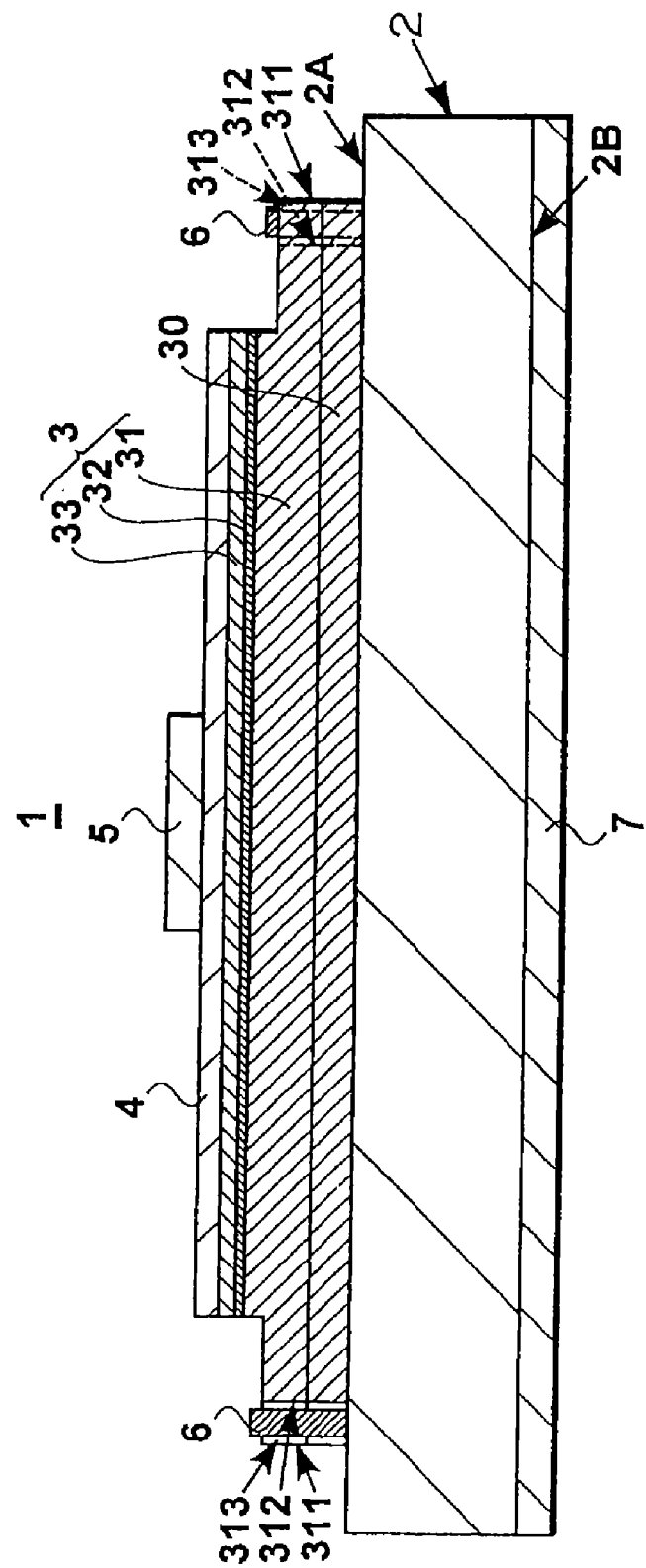
FIG. 1 is a cross sectional view of a semiconductor light emitting device according to a first embodiment of the invention (taken along line F1-F1 in FIG. 2).

The invention will be described with reference to the attached drawings. Like or corresponding parts are denoted by like or corresponding reference numerals. The drawings are schematic, and may sometimes differ from actual components. Further, dimensions and ratios of components may be different between drawings.

While the invention herein is disclosed by means of specific embodiments and applications thereof, numerous modifications and variations could be made thereto without departing from the scope of the invention set forth in the claims.

First Embodiment

In a first embodiment, the invention relates to a semiconductor light emitting device 1 which is constituted by a semiconductor light emitting diode including semiconductor light emitting layers made by nitride semiconductors.

[Configuration of Semiconductor Light Emitting Device]

Figure 2:
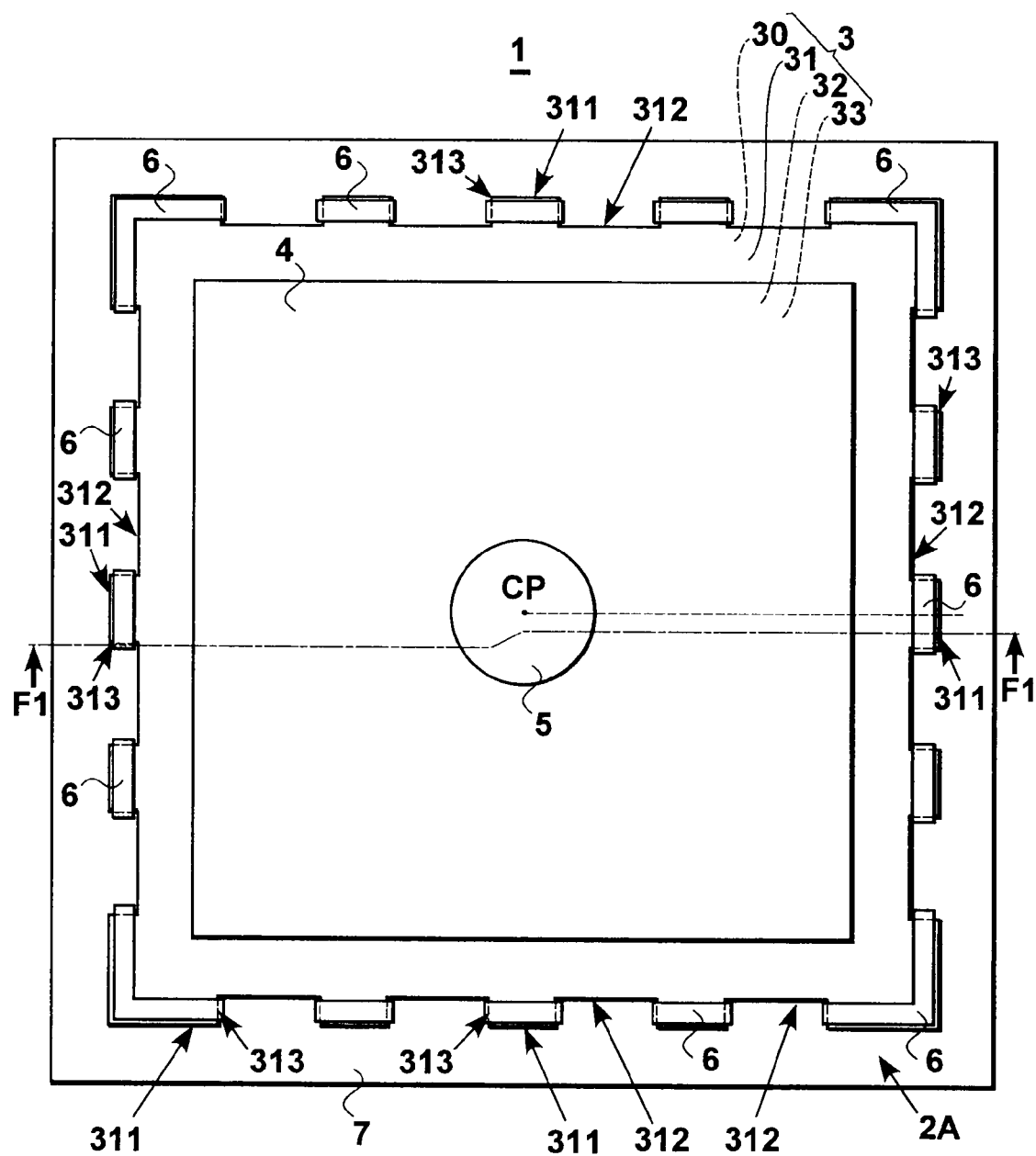
FIG. 2 is a top plan view of the semiconductor light emitting device of the first embodiment.
Figure 3:
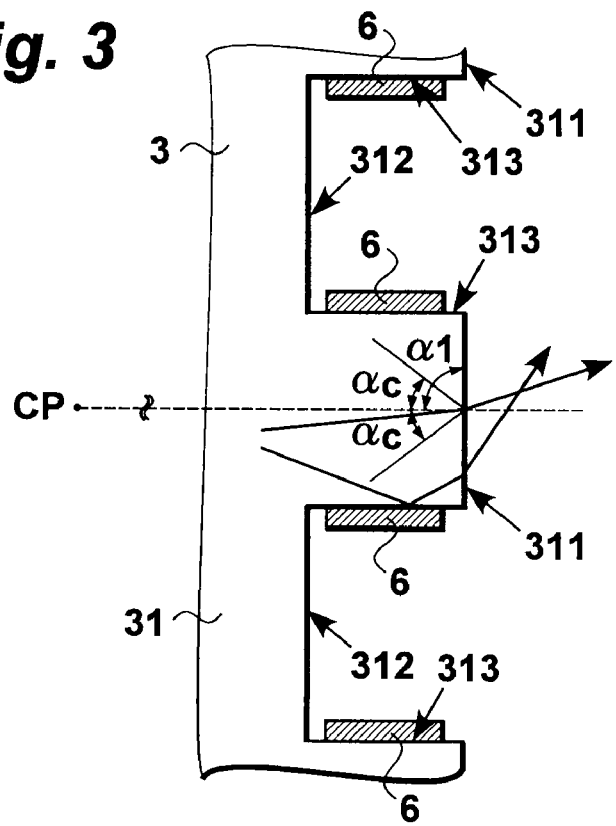
FIG. 3 is an enlarged top plan view of an essential part of the semiconductor light emitting device of the first embodiment.
Figure 4:
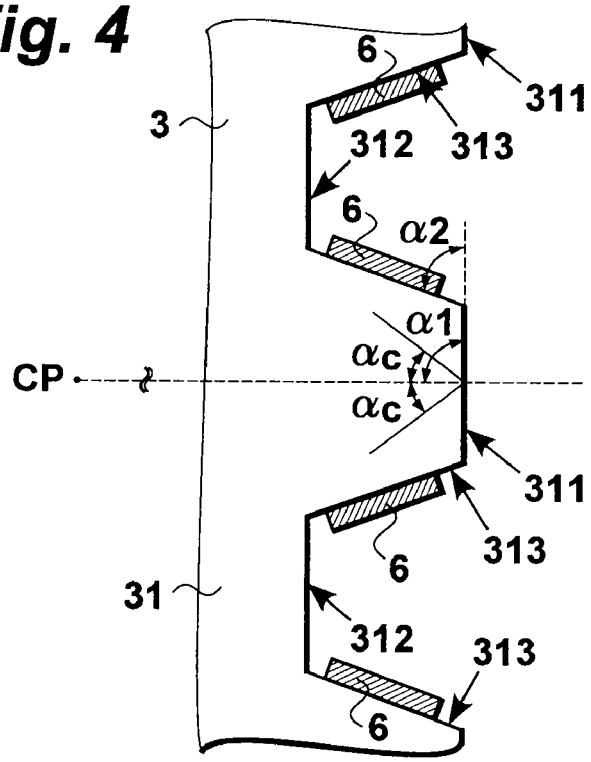
FIG. 4 is an enlarged top plan view of an essential part of a modified semiconductor light emitting device in the first embodiment.

Referring to FIG. 1 to FIG. 3, the semiconductor light emitting device 1 (called the "light emitting device 1" hereinafter) includes: a conductive substrate 2; a semiconductor light emitting layer 3 (called the "light emitting layer 3"); first light emitting spots 311 and 312; second light emitting spots 313; and wirings 6. The light emitting layer 3 is constituted by a first semiconductor layer 31 having first conductivity and positioned on a front surface (a main surface) 2A of the conductive substrate 2, and a second semiconductor layer 33 having second conductivity, which is opposite to the first conductivity, and positioned on the first semiconductor layer 31 on the front surface 2A of the conductive substrate 2. The first light emitting spots 311 and 312 are alternately provided on a peripheral surface of the first semiconductor layer 31, and emit light to an exterior. The second light emitting spots 313 intersect with the first light emitting spots 311 and 312, and emit light whose light amount is smaller than a light amount of the first light emitting spots 311 and 312. The wirings 6 extend along the second light emitting spots 313, and electrically connect the first semiconductor layer 31 and the front surface 2A of the conductive substrate 2.

The conductive substrate 2 is partly conductive on its front surface 2A, and is usable as a direct crystal growth substrate for the light emitting layer 3 or as an indirect crystal growth substrate for the light emitting layer 3 via a buffer layer 30. In this first embodiment, the semiconductor substrate 2 is a single crystal silicon (Si) substrate, a silicon carbide (SiC) substrate or the like, for instance. The single crystal silicon substrate may be entirely conductive when impurities which reduce a resistance value are activated, or may be partly conductive when impurities which reduce the resistance value at the front surface 2A are activated. Alternatively, the conductive substrate 2 may be a substrate having a conductive silicon layer on an insulating substrate, i.e., the conductive substrate 2 may be a substrate having conductivity on the front surface 2A. As shown in FIG. 2, a planar shape of the conductive substrate 2 is a square, each side of which is 300 μm long.

The light emitting layer 3 includes the first semiconductor layer 31 placed on the front surface 2A of the conductive substrate 2 via the buffer layer 30, an active layer 32 on the first semiconductor layer 31, and the second semiconductor layer 33 on the active layer 32. The first conductivity type is "n" type while the second conductivity type is "p" type.

The buffer layer 30 is made of a nitride semiconductor, for instance, and has a multilayer structure, in which aluminum nitride (AlN) layers and gallium nitride (GaN) layers are stuck alternately and repeatedly. For instance, each AlN layer is 0.5 nm to 5.0 nm thick while each GaN layer is 5 nm to 5500 nm thick. The buffer layer 30 is not always required to have the multilayer structure of the AlN and GaN layers, and may be replaced by a nitride semiconductor layer which is made of aluminum indium nitride (AlInN) layers, gallium aluminum nitride (AlGaN) layers or gallium indium aluminum nitride (AlInGaN) layers. Further, the buffer layer 30 may be made of gallium indium nitride (InGaN) layers, AlInN layers, AlGaN layers or AlInGaN layers in place of GaN layers. Still further, the buffer layer 30 may have a single layer structure, and may be a single AlN layer, a single GaN layer or the like.

The buffer layer 30 may be omitted when the first semiconductor layer 31, active layer 32 and second semiconductor layer 33 demonstrate excellent epitaxial growth on the front surface 2A of the conductive substrate 2. Further, when the buffer layer 30 and the first semiconductor layer 30 have the same conductivity type, i.e. n type conductivity, they are considered to be the semiconductor layer 31. This means that the buffer layer 30 may be omitted in the light emitting device 1 of the first embodiment without any inconvenience.

The first semiconductor layer 31 of the light emitting layer 3 is an n type clad layer placed between the buffer layer 30 and the active layer 32. The n type clad layer has a band gap which is larger than a band gap of the active layer 32. The first semiconductor layer 31 is a nitride semiconductor layer made of n type GaN or the like. Alternatively, the n type clad layer may be a nitride semiconductor layer made of AlInGaN, AlGaN or the like. In this first embodiment, a total thickness of the buffer layer 30 and the first semiconductor layer 31 is 2.6 μm to 5.2 μm, for instance.

The active layer 32 is placed between the first semiconductor layer (n type clad layer) 31 and the second semiconductor layer (p type clad layer) 33 in order to constitute a double hetero junction LED. The active layer 32 is made of a nitride semiconductor layer such as InGaN or the like, and is 50 nm to 100 nm thick, for instance.

In FIG. 1, the active layer 32 is schematically depicted as one layer, but actually has the multiquantum well structure (MQW). Alternatively, the active layer 32 may have the single quantum well structure (SQW), or may be constituted by a single semiconductor layer. Further, when the first and second semiconductor layers 31 and 33 are directly joined, the active layer 32 may be omitted.

The second semiconductor layer 33 is a p type clad layer of which band gap is larger than the band gap of the active layer 32. The p type clad layer is a nitride semiconductor layer of p type GaN or the like, for instance. Alternatively, the p type clad layer may be replaced by another nitride semiconductor layer such as AlInGaN, AlGaN and so on. The second semiconductor layer 33 is 0.15 μm to 0.60 μm thick, for instance.

A light transmitting conductive film 4 and a first electrode 5 are placed in series on the second semiconductor layer 33. The light transmitting conductive film 4 is connected to the second semiconductor layer 33 with low resistance (with the ohmic contact) and is an indium tin oxide (ITO) layer, for instance. Alternatively, the light transmitting conductive film 4 may be a gold-nickel (Au—Ni) alloy film. The light transmitting conductive film 4 functions to uniformly distribute a current flowing to the light emitting layer 3. When uniform current distribution is not necessary, the light transmitting conductive film 4 may be omitted. In this embodiment, the first electrode 5 is an anode electrode, and is made of an Au layer, for instance.

A second electrode 7 is a counterpart of the first electrode 5, and is positioned on a rear surface 2B of the conductive substrate 2 as shown in FIG. 1. The rear surface 2B is opposite to the front surface 2A of the conductive substrate 2. The second electrode 7 is a cathode electrode, and is made of an Au or Al layer.

The first light emitting spots 311 are present around the first semiconductor layer 31 of the lighting emitting layer 3, are adjacent to the first light emitting spots 312, and are high compared to the first light emitting spots 312. The first light emitting spots 312 are low compared to the first light emitting spots 311. In short, the first light emitting spots 311 are in the shape of projections while the first light emitting spots 312 are in the shape of hollows. The first light emitting spots 311 and 312 are alternately positioned around the light emitting layer 31. Projections and hollows like the first light emitting spots 311 and 312 are provided around the buffer layer 30.

The second light emitting spots 313 are the side surfaces between the first light emitting spots 311 and 312. That is to say, the second light emitting spots 313 are the surface which exists between the two surfaces where the level differs. The second light emitting spots 313 emit light between "an amount which is smaller than those of the first light emitting surfaces 311 and 312, and an amount which is zero".

Referring to FIG. 2, a lower part of the semiconductor layer 31 and the buffer layer 30 are in the shape of planar squares. An upper part of the first semiconductor layer 31, active layer 32 and second semiconductor layer 33 are in the shape of planar squares which are smaller than and similar to those of the first semiconductor 31 and buffer layer 30. Specifically, the first mentioned squares have four sides which are 250 µm to 280 µm long, for instance. The second mentioned squares have four sides which are 200 µm to 280 µm long. There is a flat part between the top and bottom of the first semiconductor layer 31. In short, this flat part is an upper surface of the part under the first semiconductor layer 31.

Each light emitting spot 311 is 20 µm to 50 µm long on the periphery of the light emitting layer 3. Each first light emitting spot 312 is 20 µm to 100 µm long on the periphery of the light emitting layer 3. Each second light emitting spot 313 is 3 µm to 20 µm long on the periphery of the light emitting layer 3 (between every adjacent first light emitting spots 311 and 312).

As shown in FIG. 2 and FIG. 3, an angle $\alpha 1$ of 90 degrees (perpendicular) is formed by each first light emitting spot 311 with respect to an imaginary broken line drawn between the first light emitting spot 311 at the right center side of the light emitting layer 3 and the center CP of the light emitting layer 3. The broken line corresponds to a planar normal of the first light emitting spot 311. The first light emitting spots 311 and 312 are adjacent one another, and are parallel in this first embodiment.

Although not shown, the light emitting layer 3 is covered by a light transmitting sealant. The sealant may be an epoxy resin, for instance. The light emitting layer 3 made of the nitride semiconductor such as GaN has a refraction factor of 2.5, for instance. The epoxy sealant has a refraction factor of 1.5, for instance. Under the foregoing conditions, light is incident on the first light emitting spots 311 within a critical angle $\alpha c$, and can be emitted from the first light emitting spots 311 to the exterior. The critical angle $\alpha c$ is ±37 degrees with respect to the planar normal of the first light emitting spots 311, and depends upon variations of the refraction factors of the light emitting layer 3 and the sealant.

Referring to FIG. 3, the second light emitting spots 313 intersect with the first light emitting spots 311 and 312 when the critical angle $\alpha c$ is within the foregoing range with respect to the planar normal of the first light emitting spots 311. In this first embodiment, the second light emitting spots 313 intersect with the first light emitting spots 311 and 312 with the angle of 90 degrees. In short, the second light emitting spots 313 are parallel to the planar normal of the first light emitting spots 311.

The second light emitting spots 313 are only required to intersect with the first light emitting spots 311 and 312 within the critical angle $\alpha c$. Therefore, the second light emitting spots 313 may intersect with the first light emitting spots 311 with a tolerable angle $\alpha 2$ of 53 degrees or larger.

The wirings 6 are laid on the second light emitting spots 313 between the first light emitting sports 311 and 312, and are positioned in such a manner that the wirings 6 do not block light emitted from the first light emitting spots 311 and 312. The wirings 6 short circuit a section between the first semiconductor layer 31 and the front surface 2A of the conductive substrate 2. Fundamentally, the wirings 6 may extend on the second light emitting sports 313 between the side surface of the first semiconductor layer 31 and the front surface 2A of the conductive substrate 2. In this embodiment, the wirings 6 also extend on a bottom surface of the first semiconductor layer 31. The wirings 6 are made of a material which has a resistance value lower than a resistance value of the current path extending via an interface between the first semiconductor layer 31 and the conductive substrate 2. Specifically, the wirings 6 may be Al layers which are 100 nm to 200 nm thick. Alternatively, the wirings 6 may be composite films which are constituted by a composite film of titanium (Ti) layers covered by Al layers, a composite film of Ti layers covered by Au layers, a conductive polycrystalline Si layers containing alloy layers, or the like.

[Method of Fabricating Light Emitting Device]

The light emitting device 1 will be fabricated by the following processes. Refer to FIG. 1 to FIG. 3.

First of all, the light emitting layer 3 is formed all over the front surface 2A of the conductive substrate 2 which is in a state of a wafer at this time point. The buffer layer 30, first semiconductor layer 31, active layer 32 and second semiconductor layer 33 of the light emitting layer 3 are formed by the epitaxial growth technology such as the MOVPE (metal organic phase epitaxy) technology or MBE (molecular beam epitaxy) technology.

The conductive light transmitting film 4 is vapor evaporated, plated or spattered on the light emitting layer 3. Upper parts of the light transmitting conductive film 4, second semiconductor layer 33 of the light emitting layer 3, active layer 32 and first semiconductor layer 31 are patterned by the anisotropic etching using a photolithographic mask.

The bottom of the first semiconductor layer 31 and buffer layer 30 are patterned by the isotropic etching, so-called mesa etching, using a photolithographic mask. In this state, a profile of the bottom of the first semiconductor layer 31 and buffer layer 30 is settled, and the first light emitting spots 311 and 312 and the second light emitting spots 313 are formed while the first semiconductor layer 31 and buffer layer 30 undergo the mesa etching. This means that no additional fabricating process is necessary for making the first and second light emitting spots 311, 312 and 313.

The wirings 6 are laid on the second light emitting spots 313 using the lift off technology. With the lift off technology, a mask is formed on parts of the second light emitting spots 313 where the wirings 6 are not present. The wirings 6 are laid by a film forming technology having strong directivity such as the vapor evaporation, plating, spattering or the like. Thereafter, the mask and unnecessary parts of the wirings 6 will be removed.

The first electrode 5 is made on the light transmitting conductive film 4, and the second electrode 7 is made on the rear surface 2B of the conductive substrate 2. In this state, the light emitting device 1 will be completed.

The light emitting device 1 of this first embodiment includes the first and second light emitting spots 311, 312 and 313 around the first semiconductor layer 31 of the semiconductor light emitting layer 3, and the wirings 6 on the second light emitting spots 313. The wirings 6 are effective in reducing the forward resistance between the conductive substrate 2 and the semiconductor layer 31 (of the light emitting layer 3 on the front surface 2A of the conductive substrate 2). Further, light can be emitted, without being blocked, from the first light emitting spots 311 and 312 on the side surfaces of the light emitting layer 3. This improves the light emitting efficiency of the light emitting device 1.

Second Embodiment

In a second embodiment, shapes of parts around the light emitting layer 3 are modified in the light emitting device 1 of the first embodiment.

[Configuration of Light Emitting Device]

Figure 5:
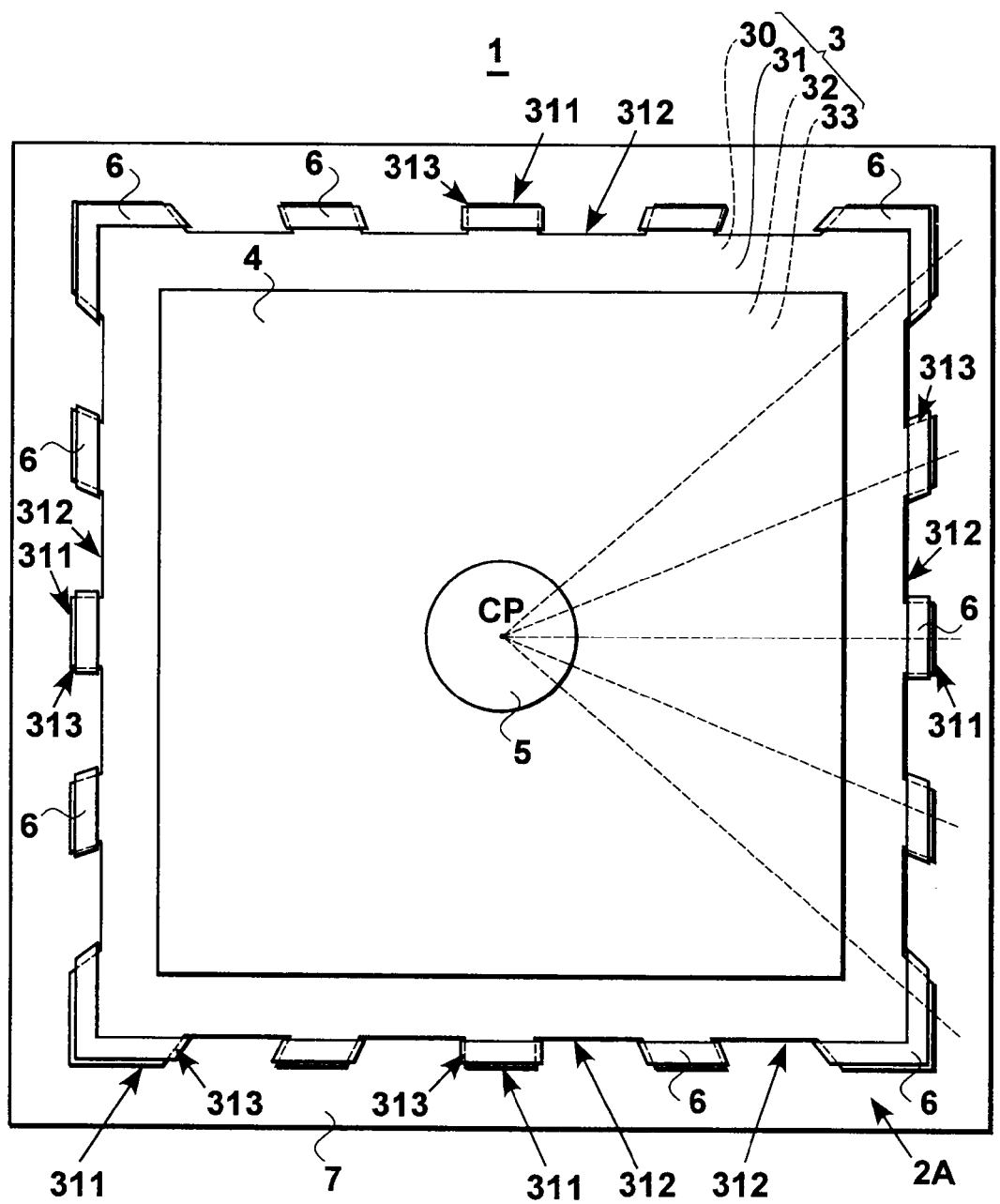
FIG. 5 is a top plan view of a semiconductor light emitting device according to a second embodiment of the invention.

Referring to FIG. 5, the first light emitting spots 311 and 312 intersect with the second light emitting spots 313 with different angles. Specifically, the second light emitting spots 313 are arranged to be as parallel as possible to the imaginary broken lines, which radially extend from the center CP of the light emitting layer 3, so that light is not excessively blocked at the second light emitting spots 313.

The light emitting device 1 of the second embodiment is not only as effective as the light emitting device 1 of the first embodiment but also can reduce an amount of light blocked by the wirings 6 at the corners of the light emitting layer 3, and improve the light emitting efficiency.

Other Embodiments

While there has been described what are at present considered to be the first and second embodiments of the invention, it will be understood that various modifications may be made thereto, and it is intended that the appended claims cover all such modifications as fall within the true spirit and scope of the invention. For instance, in the foregoing embodiments, the first light emitting spots 311 and 312 and the second light emitting spots 313 are arranged one after another around the entire periphery of the light emitting layer 3 of the light emitting devices 1. Alternatively, the second light emitting spots 313 may be positioned at the corners of the light emitting layer 3, and the wirings 6 may be made on the second light emitting spots 313.

Further, the wirings 6 short circuit the area between the conductive substrate 2 and the first semiconductor layer 31. Alternatively, the wirings 6 may be configured to short circuit the area between the buffer layer 30 and the first semiconductor layer 31, and may be positioned at the area to be short circuited.

Still further, the conductive substrate 2 is the Si or SiC substrate. Alternatively, the conductive substrate 2 may be a GaAs, a GaN, an AlN or an AlGaN substrate, or an oxidized conductive substrate such as a ZnO substrate. The conductive substrate 2 is not always limited to the single conductive substrate, but may be a conductive substrate including layers of oxidized conductive compounds such as Si or SiC.

What is claimed is:

1. A semiconductor light emitting device comprising:
   a conductive substrate;
   a semiconductor light emitting layer which includes a first semiconductor layer formed on one surface of the conductive substrate and having a first conductivity type, and a second semiconductor layer formed on the first semiconductor layer and having a second conductivity type opposite to the first conductivity type;
   first light emitting spots which are alternately arranged around a periphery of the first semiconductor layer and emitting light to an exterior from the semiconductor light emitting layer;
   second light emitting spots having surfaces intersecting with the first light emitting spots and emitting light at an amount smaller than an amount of light emitted via the first light emitting spots; and
   wirings arranged along the second light emitting spots and leaving the first light emitting spots exposed, the wirings electrically short circuiting an area between the first semiconductor layer and the one surface of the conductive substrate,
   wherein the first light emitting spots are in the shape of projections and hollows, and the second light emitting spots are side surfaces between the first light emitting spots in the semiconductor light emitting layer.

2. The semiconductor light emitting device defined in claim 1, wherein the second light emitting spots are positioned within a critical angle with respect to a planar normal of the first light emitting spots, light being emitted from the semiconductor light emitting layer to the exterior within the critical angle.

3. The semiconductor light emitting device defined in claim 2, wherein the second light emitting spots are parallel to the planar normal of the first light emitting spots.

4. The semiconductor light emitting device defined in claim 2, wherein the second light emitting spots are arranged to be as parallel as possible to a direction, which radially extend from the center of the light emitting layer.

5. The semiconductor light emitting device defined in claim 1, wherein the conductive substrate is a Si or a SiC substrate, or a GaAs, a GaN, an AlN or an AlGaN substrate, or an oxidized conductive substrate which is a ZnO substrate, or a substrate including layers of oxidized conductive compounds.

6. The semiconductor light emitting device defined in claim 1, wherein the first and second semiconductor layers are a GaN, an AlInGaN or an AlGaN.

7. The semiconductor light emitting device defined in claim 1, wherein the wirings are made of a material having a specific resistance value smaller than a specific resistance value of a path via which a current flows to the conductive substrate from the first semiconductor layer via an interface between them.

8. The semiconductor light emitting device defined in claim 7, wherein the wirings are Al layers or composite films which are Ti layers and Al layers or Ti layers and Au layers.

9. A semiconductor light emitting device comprising:
   a conductive substrate having a conductor on one surface thereof;

a semiconductor light emitting layer which includes a first nitride semiconductor layer positioned on one surface of the conductor of the conductive substrate and having a first conductivity type, and a second nitride semiconductor layer positioned on the first nitride semiconductor layer and having a second conductivity type opposite to the first conductivity type;

first light emitting spots which are alternately arranged around a periphery of the first nitride semiconductor layer and emitting light to an exterior from the semiconductor light emitting layer;

second light emitting spots having a surface intersecting with the first light emitting spots and emitting light at an amount smaller than an amount of light emitted via the first light emitting spots; and wirings arranged along the second light emitting spots and leaving the first light emitting spots exposed, the wirings electrically short circuiting an area between the first nitride semiconductor layer and the one surface of the conductive substrate, wherein the first light emitting spots are in the shape of projections and hollows, and the second light emitting spots are side surfaces between the first light emitting spots in the semiconductor light emitting layer.

* * * * *